(12) United States Patent
Soares et al.

(10) Patent No.: US 7,212,040 B2
(45) Date of Patent: May 1, 2007

(54) STABILIZATION OF STATE-HOLDING CIRCUITS AT HIGH TEMPERATURES

(75) Inventors: Marshall Soares, Tayorsville, UT (US); Venkatajaya K. Yelisetty, Salt Lake City, UT (US)

(73) Assignee: IntelliServ, Inc., Provo, UT (US)

( * ) Notice: Subject to any disclaimer, the term of this patent is extended or adjusted under 35 U.S.C. 154(b) by 16 days.

(21) Appl. No.: 11/129,978

(22) Filed: May 16, 2005

(65) Prior Publication Data

US 2006/0255851 A1    Nov. 16, 2006

(51) Int. Cl.
*G11C 11/00* (2006.01)
*H03K 3/12* (2006.01)

(52) U.S. Cl. .................. 327/51; 327/217; 327/362; 327/225; 365/207; 365/154

(58) Field of Classification Search ........ 327/198–200, 327/51, 216, 218, 362, 50, 225; 365/154, 365/207
See application file for complete search history.

(56) References Cited

U.S. PATENT DOCUMENTS

| | | | |
|---|---|---|---|
| 2,414,719 A | 1/1947 | Cloud | |
| 3,518,608 A | 6/1970 | Papadopoulos | |
| 4,739,325 A | 4/1988 | MacLeod | |
| 4,788,544 A | 11/1988 | Howard | |
| 6,012,015 A | 1/2000 | Tubel | |
| 6,252,518 B1 | 6/2001 | Laborde | |
| 6,369,646 B1 | 4/2002 | Kesler et al. | |
| 6,373,310 B1 * | 4/2002 | Jacobs | 327/217 |
| 6,392,317 B1 | 5/2002 | Hall et al. | |
| 6,650,176 B1 | 11/2003 | Lorenz | |
| 6,670,880 B1 | 12/2003 | Hall et al. | |
| 6,688,396 B2 | 2/2004 | Floerke et al. | |
| 6,707,708 B1 * | 3/2004 | Alvandpour et al. | 365/154 |
| 6,717,501 B2 | 4/2004 | Hall et al. | |
| 6,777,781 B1 | 8/2004 | Lorenz | |
| 6,799,632 B2 | 10/2004 | Hall et al. | |
| 6,821,147 B1 | 11/2004 | Hall et al. | |
| 6,830,467 B2 | 12/2004 | Hall et al. | |
| 6,844,498 B2 | 1/2005 | Hall et al. | |
| 6,847,252 B1 | 1/2005 | Ono et al. | |
| 6,864,708 B2 | 3/2005 | Takahashi et al. | |
| 6,865,306 B2 | 3/2005 | Boyle et al. | |
| 6,888,473 B1 | 5/2005 | Hall et al. | |

(Continued)

OTHER PUBLICATIONS

PCT/US03/16475, Published Dec. 4, 2003, Applicant Baker Hughes; International Search Report: "Documents Considered to Be Relevant".

*Primary Examiner*—Dinh T. Le
(74) *Attorney, Agent, or Firm*—Daniel P. Nelson; Jeffery E. Daly (57) ABSTRACT

A state-holding circuit having improved stability at high temperatures includes a bi-stable circuit capable of assuming one of two reversible and stable states. The bi-stable circuit comprises a plurality of logic components (e.g., transistors) arranged into two sides. Because each of the logic components has a leakage current and/or resistance that varies significantly as a function of temperature, one or more stabilization components, such as transistors or other devices, may be connected to a side of the bi-stable circuit to balance the leakage currents and/or resistances of each side. In certain embodiments, the sole function of the stabilization components is to balance the leakage currents and/or resistances of each side.

17 Claims, 7 Drawing Sheets

U.S. PATENT DOCUMENTS

| | | | |
|---|---|---|---|
| 6,917,192 B1 | 7/2005 | Xin-LeBlanc et al. |
| 6,918,093 B2 | 7/2005 | Broussard |
| 6,929,493 B2 | 8/2005 | Hall et al. |
| 6,945,802 B2 | 9/2005 | Hall et al. |
| 2004/0039466 A1 | 2/2004 | Lily et al. |
| 2004/0104797 A1 | 6/2004 | Hall et al. |
| 2004/0113808 A1 | 6/2004 | Hall et al. |
| 2004/0145492 A1 | 7/2004 | Hall et al. |
| 2004/0150532 A1 | 8/2004 | Hall et al. |
| 2004/0164833 A1 | 8/2004 | Hall et al. |
| 2004/0164838 A1 | 8/2004 | Hall et al. |
| 2004/0216847 A1 | 11/2004 | Hall et al. |
| 2004/0244916 A1 | 12/2004 | Hall et al. |
| 2004/0244964 A1 | 12/2004 | Hall et al. |
| 2004/0246142 A1 | 12/2004 | Hall et al. |
| 2005/0001735 A1 | 1/2005 | Hall et al. |
| 2005/0001736 A1 | 1/2005 | Hall et al. |
| 2005/0001738 A1 | 1/2005 | Hall et al. |
| 2005/0035874 A1 | 2/2005 | Hall et al. |
| 2005/0035875 A1 | 2/2005 | Hall et al. |
| 2005/0035876 A1 | 2/2005 | Hall et al. |
| 2005/0036507 A1 | 2/2005 | Hall et al. |
| 2005/0039912 A1 | 2/2005 | Hall et al. |
| 2005/0045339 A1 | 3/2005 | Hall et al. |
| 2005/0046588 A1 | 3/2005 | Hall et al. |
| 2005/0046590 A1 | 3/2005 | Hall et al. |
| 2005/0067159 A1 | 3/2005 | Hall et al. |
| 2005/0070144 A1 | 3/2005 | Hall et al. |
| 2005/0082092 A1 | 4/2005 | Hall et al. |
| 2005/0092499 A1 | 5/2005 | Hall et al. |
| 2005/0093296 A1 | 5/2005 | Hall et al. |
| 2005/0095827 A1 | 5/2005 | Hall et al. |
| 2005/0115717 A1 | 6/2005 | Hall et al. |
| 2005/0145406 A1 | 7/2005 | Hall et al. |
| 2005/0150653 A1 | 7/2005 | Hall et al. |
| 2005/0161215 A1 | 7/2005 | Hall et al. |
| 2005/0173128 A1 | 8/2005 | Hall et al. |
| 2005/0212530 A1 | 9/2005 | Hall et al. |
| 2005/0236160 A1 | 10/2005 | Hall et al. |

* cited by examiner

STABILIZATION OF STATE-HOLDING CIRCUITS AT HIGH TEMPERATURES

BACKGROUND OF THE INVENTION

The present invention relates to apparatus, systems, and methods for increasing the operability of electrical circuits at high temperatures, and more particularly for increasing the stability of state-holding circuits at high temperatures.

Boolean gates, in combination with the concept of feedback, provide the basic building blocks for modern computer memory. Typically, to convert Boolean gates into a memory device, the output of one or more of the gates is fed back into the gates' input. The result is that the new output depends on the previous output of the gates and the new output will reflect or "remember" the previous output. Because the input is typically either a high or low voltage, this type of arrangement may be used to create devices that may assume either one of two reversible and stable states. Typically, the transition from one stable state to the other is unstable. That is, during the very short period over which the transition takes place, the output of the gates may assume the same state, which state may be unpredictable.

This above-stated Boolean logic may be used to create state-holding circuits that form the most basic control and memory elements in computer and communications systems. Such state-holding circuits may include devices such as flip-flops and latches. These state-holding circuits may, in turn, be used to create devices such as registers, cache, random access memories, counters, or the like. In integrated circuits, transistors are most commonly used to implement the Boolean gates in state-holding circuits. Most transistors have a leakage current, which refers to the small amount of current that flows (or "leaks") through a transistor when it is "turned off." In an ideal transistor, the leakage current would be zero, but in practice, the leakage current always has some value.

Furthermore, the leakage current may vary significantly, even exponentially, as factors such as temperature and voltage increase. As temperatures continue to increase, the leakage current may increase to a point where a state-holding circuit is unreliable or fails completely. In some cases, high temperatures may cause state-holding circuits such as flip-flops to flip from one state to another. This may cause a computer system to crash or malfunction, or corrupt data stored in memory or registers. Due to this high-temperature instability, many integrated circuits are inoperable or unreliable above a rated temperature. In other cases, where a circuit may function at higher temperatures, the circuit's life span may be shortened.

The need is increasing for circuits, such as state-holding circuits, that function at higher temperatures than is currently possible. For example, in the oil and gas industry, there has been a long felt need for "smart" drill strings capable of transmitting formation data to the surface. As drilling, exploration, and electronics technology continues to improve, the feasibility of smart drill strings is becoming a greater reality. Indeed, as new oil and gas reserves may be in deeper, more remote, or harder to access locations, a greater need exists for smarter drill strings.

In order to implement a "smart" drill string, electronic components are needed to gather and transmit data along the drill string. Nevertheless, because drill stings may reach depths of 20,000 feet or more and may encountering temperatures at or near 300° C., current electronics may be inadequate, unreliable, or inoperable in downhole environments. Thus, improved electronic components are needed that are able to function in high-temperature downhole environments. Such components would also be useful in other high-temperature applications such as automotive, aviation, or geothermal applications.

Accordingly, what are needed are apparatus and methods for increasing the stability of electronic components and circuits in high-temperature environments. More specifically, apparatus and methods are needed to stabilize state-holding circuits at higher temperatures. Beneficially, such apparatus and methods would be simple and utilize currently available technology and components. Such apparatus and methods are disclosed and claimed herein.

BRIEF SUMMARY OF THE INVENTION

The present invention has been developed in response to the present state of the art, and in particular, in response to the problems and needs in the art that have not yet been fully solved by currently available semiconductors and electronics. Accordingly, the present invention has been developed to provide state-holding circuits that operate reliably in high-temperature environments.

Consistent with the foregoing, and in accordance with the invention as embodied and broadly described herein, a state-holding circuit having improved stability at high temperatures is disclosed in one aspect of the present invention as including a bi-stable circuit capable of assuming one of two reversible and stable states. The bi-stable circuit comprises a plurality of logic components (e.g., transistors) arranged into two sides. Typically, each side generates an output that is the inverse of the other. For example, in certain embodiments, the bi-stable circuit may include a pair of cross-coupled inverters capable of assuming two reversible and stable states.

Each of the logic components has a leakage current that varies as a function of temperature. At elevated temperatures, the leakage currents may become so pronounced that they cause the bi-stable circuit to "flip," or change from one state to another. In order to prevent "flipping," instability, or failure at high temperatures, one or more stabilization components, such as transistors or other devices, may be connected to a side of the bi-stable circuit. These stabilization components are installed to balance the leakage currents of each side of the bi-stable circuit. In certain embodiments, the sole function of the stabilization components is to balance the leakage current of each of the sides. In certain embodiments, the stabilization components are simply dead gates.

A state-holding circuit in accordance with the invention may be a RAM cell, a flip-flop, a latch, or similar circuit. Likewise, the state-holding circuit may be implemented using any suitable technology, including but not limited to application-specific integrated chips (ASICs), field programmable gate arrays (FPGAs), discrete logic, or the like. In some cases, in order to reduce leakage currents, a state-holding circuit in accordance with the invention may be implemented using silicon-on-insulator (SOI) technology.

The present invention provides novel apparatus and methods for stabilizing state-holding circuits at high temperatures. The features and advantages of the present invention will become more fully apparent from the following description and appended claims, or may be learned by the practice of the invention as set forth hereinafter.

BRIEF DESCRIPTION OF THE DRAWINGS

In order to describe the manner in which the above-recited features and advantages of the present invention are obtained, a more particular description of apparatus and methods in accordance with the invention will be rendered by reference to specific embodiments thereof, which are illustrated in the appended drawings. Understanding that these drawings depict only typical embodiments of the present invention and are not, therefore, to be considered as limiting the scope of the invention, apparatus and methods in accordance with the present invention will be described and explained with additional specificity and detail through the use of the accompanying drawings in which.

DETAILED DESCRIPTION OF THE INVENTION AND THE PREFERRED EMBODIMENT

Reference throughout this specification to "one embodiment," "an embodiment," or similar language means that a particular feature, structure, or characteristic described in connection with the embodiment is included in at least one embodiment in accordance with the present invention. Thus, use of the phrases "in one embodiment," "in an embodiment," and similar language throughout this specification may, but does not necessarily, all refer to the same embodiment.

Furthermore, the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

For the purposes of this specification, use of the term "1" generally means a "high" voltage and use of the term "0" generally means "low" voltage or ground. These terms may be used interchangeably.

Figure 1:
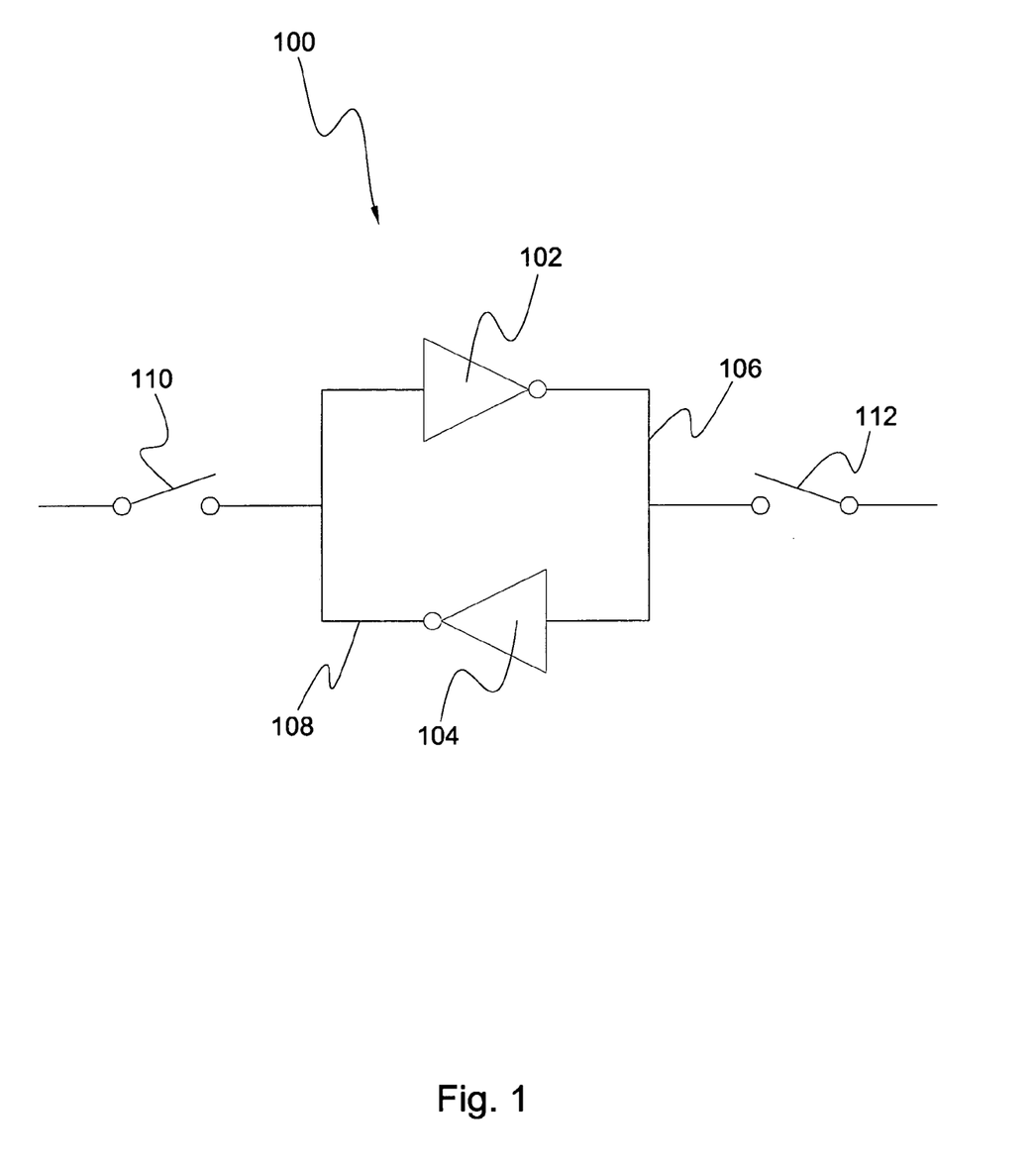
FIG. 1 is a high-level Boolean diagram illustrating one embodiment of a bi-stable memory cell using a pair of cross-coupled inverters.

Referring to FIG. 1, most circuits, at their most basic level, are constructed of simple Boolean gates. One of the fundamental uses for Boolean gates is that of creating memory. By interconnecting the gates correctly, they will remember or store an input value. This concept forms the basis of random access memory (RAM) and also provides the basis for other useful circuits such as latches and flip-flops. These circuits, in turn, may be used to construct useful devices such as registers, cache, counters, or the like.

Memories rely on the concept of feedback, wherein the output of one or more gates is routed back into the gates' inputs. As illustrated, a simple feedback circuit 100, which may form the conceptual basis for many RAM cells, may use two inverters 102, 104. The output of the first inverter 102 is fed back into the input of the second inverter 104. As a result, the feedback circuit 100 may store two different states. The first state stores a "1" on the output of the inverter 102 (i.e., path 106) and a "0" on the output of the inverter 104 (i.e., path 108). The second state stores a "0" on the output of the inverter 102 and a "1" on the output of the inverter 104. One or more switches 110, 112 may be used to set the state to a desired value (i.e., write a data value to the feedback circuit 100) or, alternatively, read the current state (i.e., read a data value from the feedback circuit 100).

Figure 2:
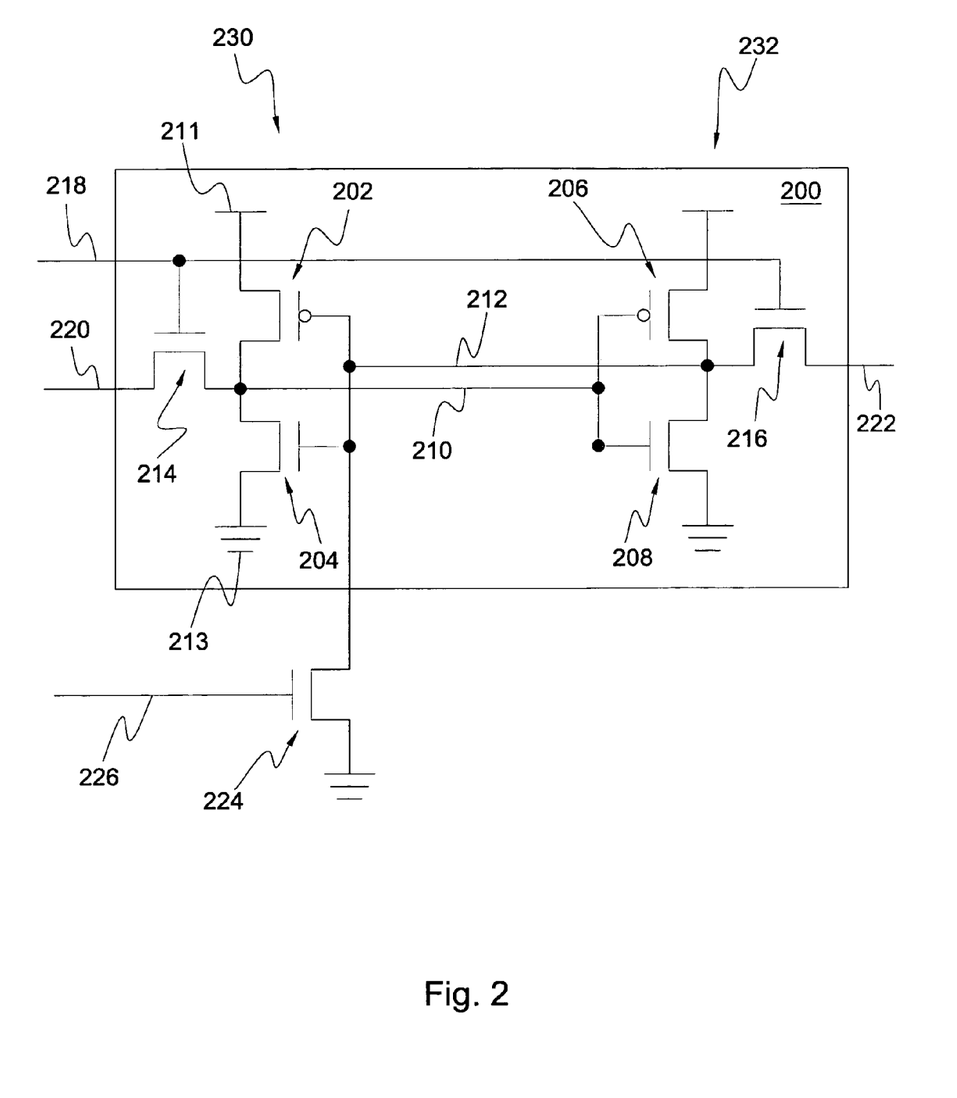
FIG. 2 is a schematic diagram of one embodiment of a bi-stable memory cell in an unbalanced state due to the addition of a reset circuit.

Referring to FIG. 2, one embodiment of a six-transistor SRAM cell 200 is illustrated. The cell 200 may provide a real-world implementation of the feedback circuit 100 illustrated in FIG. 1. The cell 200 may include a first pair of transistors 202, 204, forming a first inverter, and a second pair of transistors 206, 208, forming a second inverter. The first inverter 202, 204 outputs a value on the line 210 and the second inverter 206, 208 outputs a value on the line 212. The line 210 is connected to the input of the second inverter 206, 208. Likewise, the line 212 is connected to the input of the first inverter 202, 204.

In operation, when the line 212 is high, the transistor 202 is open, or turned off, and the transistor 204 is closed, or turned on, creating a short between the line 210 and ground 213. This produces a low value on the line 210. Similarly, when the line 212 is low, the transistor 202 is closed, or turned on, and the transistor 204 is open, or turned off, creating a short between the line 210 and the voltage source 211. This produces a high value on the line 210. This same logic applies to the inverter 206, 208. In this manner, the lines 210, 212, always store opposite values—i.e., either a high or a low value. The lines 210, 212, may serve as both an output and an input of data to the memory cell 200.

A pair of transistors 214, 216 may enable the reading or writing of data to the cell 200. When the line 218 is high, the transistors 214, 216 are turned on, thereby creating a direct connection between the lines 220, 222 and the lines 210, 212. This may allow values to be read from the lines 210, 212, or alternatively, be written to the lines 210, 212. In certain embodiments, the line 218 may be considered a read or write enable line, or a combination thereof.

In many cases, it may be desired or necessary to add components or circuitry to the cell 200 to provide additional functions. For example, in certain embodiments, a transistor 224 or other component or circuit may be added to the cell 200 to allow it to be reset. The memory cell 200 may be reset by applying a high signal on the line 226. While adding one or more components, such as a reset circuit 224, may be straightforward and even routine in many conventional circuits, this may cause special problems in circuits that operate at high temperatures.

For example, as was discussed in the background section of the present specification, many transistors and other semiconductor devices have a leakage current. This leakage current may increase substantially as temperature and/or voltage increases. This leakage current varies because the resistance of a transistor or other semiconductor device varies as a function of temperature and/or voltage. Consequently, when a component 224, such as a transistor 224, is added to one side of the memory cell 200, the two sides 230, 232 of the memory cell 200 may become imbalanced.

This type of imbalance may be tolerated at lower operating temperatures because the operating current of transistors and other semiconductor devices may greatly exceed the leakage current at lower temperatures. However, this imbalance may create problems at higher temperatures due to the added leakage current and/or reduced resistance of the device 224. As temperature increases, the leakage current may become so pronounced that it causes the memory cell 200 to flip from one state to another. This may cause data loss, corruption, or cause the memory cell 200 to fail completely. Thus, apparatus and methods are needed to balance the memory cell 200 to allow for operation at higher temperatures.

Figure 3:
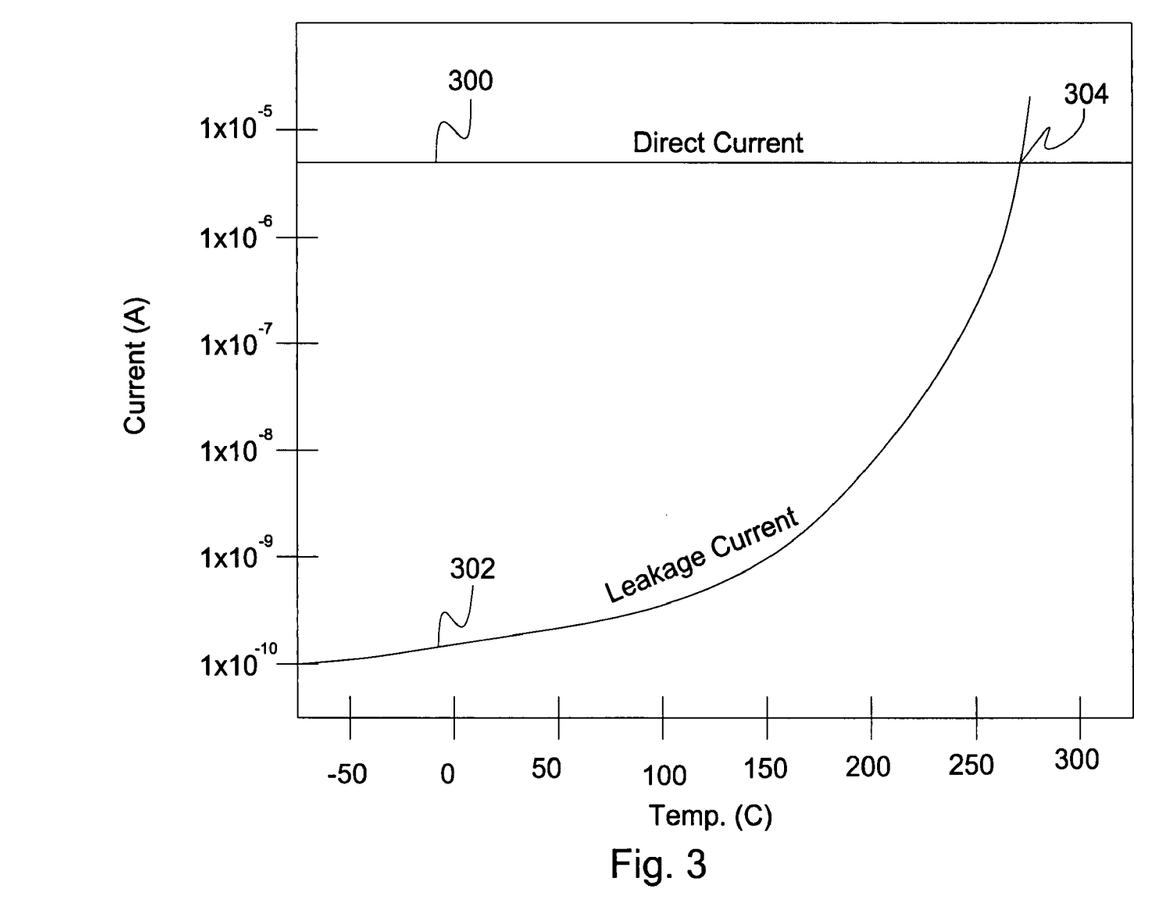
FIG. 3 is a graph illustrating one example of the relationship between the operating current and the leakage current of semiconductor devices as a function of temperature.

Referring to FIG. 3, a graph showing one example of the relationship between the operating current and the leakage current of a transistor as a function of temperature is illustrated. This graph is presented merely by way of example. One of ordinary skill in the art will recognize that, as different devices or semiconductor technologies are used, the numbers and contours of the graph may change accordingly.

As shown, the operating current 300 of a transistor, or a group of transistors, may remain relatively constant, or stable, as a function of temperature. However, the leakage current 302 may increase substantially as temperature increases. In certain embodiments, the leakage 302 current may increase exponentially, or substantially exponentially, as a function of temperature. At some point 304, the leakage current 302 may actually equal or exceed the operating current 300. In some types of semiconductors, such as silicon-on-insulator technology, this event may occur somewhere between the temperatures of 250° C. and 300 C.

In certain embodiments, a bi-stable circuit, such as the memory cell 200 illustrated in FIG. 2 may flip from one state to another or cease to function when the leakage current 302 equals the operating current 300. In other embodiments, the bi-stable circuit may malfunction or cease to function at some point before the leakage current 302 actually equals the operating current 300. At whatever temperature a bi-stable circuit fails or malfunctions, an imbalanced condition like that illustrated in FIG. 2 may exacerbate or worsen the problem.

Figure 4:
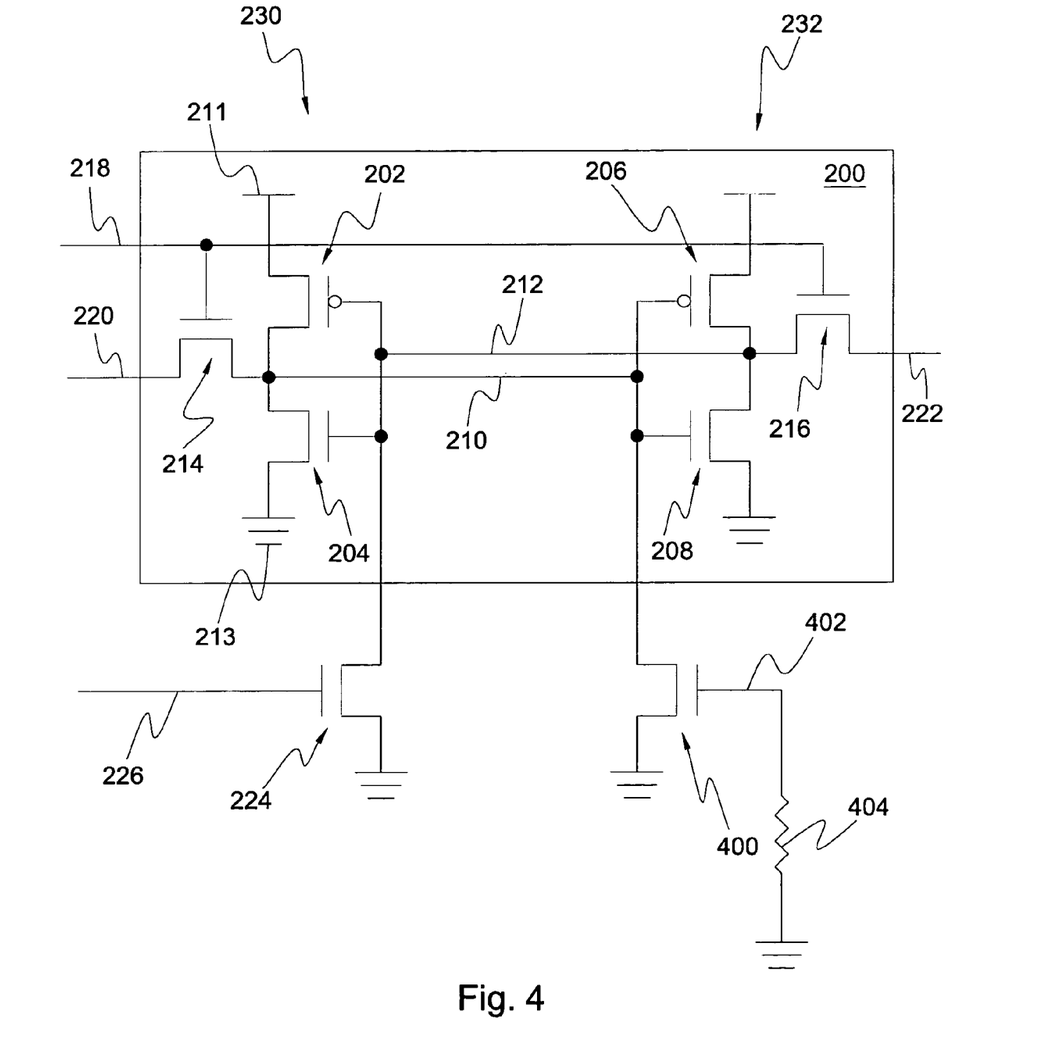
FIG. 4 is a schematic diagram of the memory cell of FIG. 2 balanced to compensate for the reset circuit.

Referring to FIG. 4, in selected embodiments, a component 400, such as a transistor 400, may be added to the memory cell 200 to balance the two sides 230, 232. The component 400 may balance the resistance of the two sides 230, 232 of the memory cell 200 and thus balance the leakage current of the two sides 230, 232. Because the component 400 may be identical or nearly identical to the component 224, the resistance and leakage current of the components 400, 224 may behave identically or nearly identically as a function of temperature. Thus, the resistance and leakage current may be balanced or nearly balanced for both sides 230, 232 of the memory cell 200 for most temperatures.

In certain embodiments, the sole purpose of the component 400 may be to balance the memory cell 400 and compensate for the imbalance created by the circuit 224, in this case a reset circuit 224. Thus, the component 400 may simply be a dead gate. A line 402 may simply be connected to ground by way of a resistor 404. In other embodiments (not shown), the component 400 may provide some function to the circuit 200. For example, a transistor 400 may be used in combination with the transistor 224 to reset the circuit 200. Thus, in certain embodiments, the component 400 may be functional while maintaining the balance of the circuit 200.

The example illustrated in FIG. 4 illustrates the imbalance created by a simple reset circuit 224 consisting of a single component 224, and the balance achieved by adding an identical or similar component 400. One of ordinary skill in the art will recognize, however, that more than one component may create an imbalance between the sides 230, 232 of the memory cell 200. Thus, in certain embodiments, more than one component may be added to the memory cell 200 to balance the two sides 230, 232 of the memory cell 200. Thus, the example illustrated in FIG. 4 is simply presented by way of example and is not intended to limit the invention to the illustrated embodiment.

Figure 5:
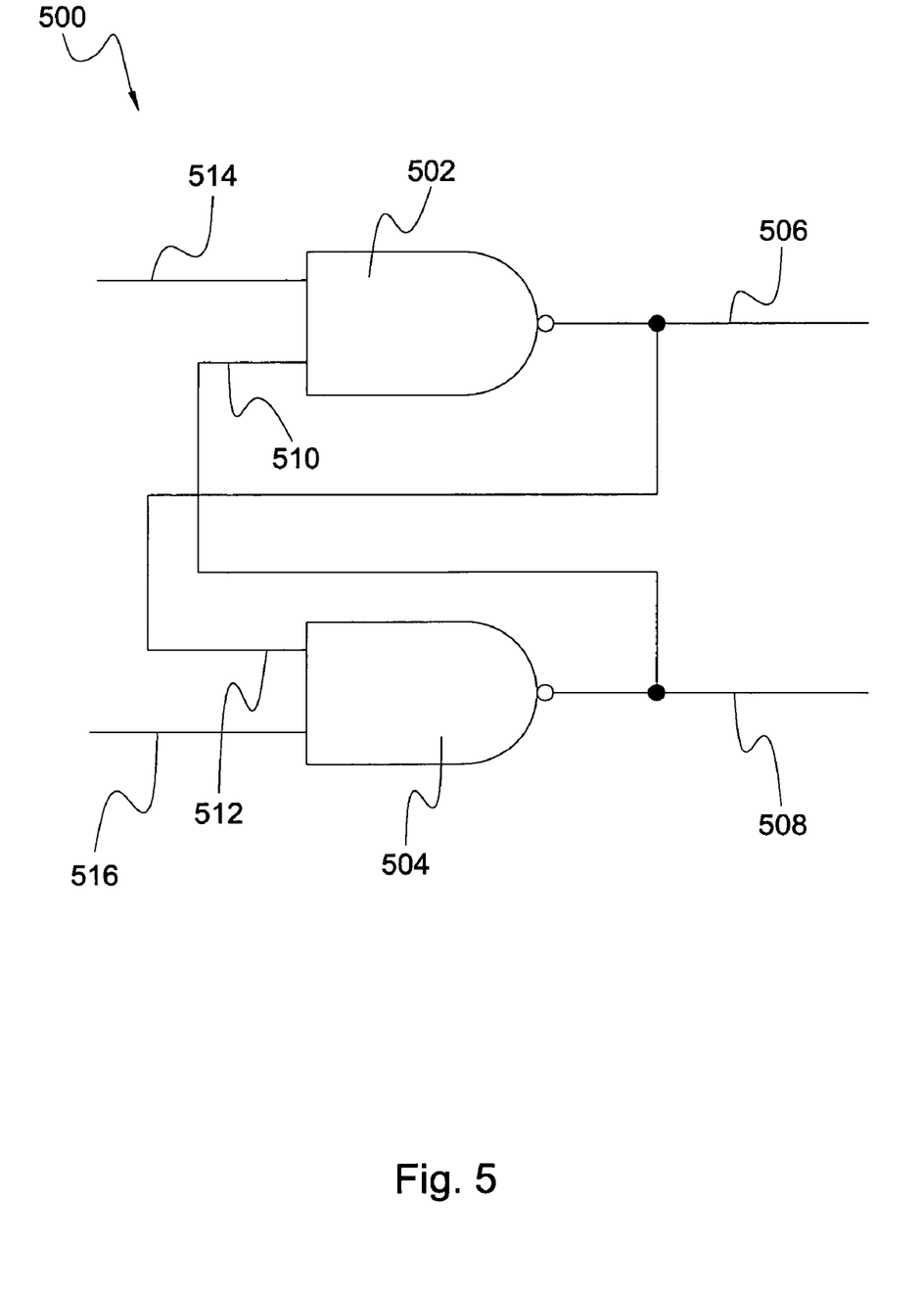
FIG. 5 is a high-level Boolean diagram illustrating one embodiment of a bi-stable circuit using a pair of NAND gates.

Referring to FIG. 5, in another embodiment in accordance with the invention, a pair of NAND gates 502, 504 may be used to create a bi-stable circuit 500. Such a circuit 500 may provide a basic building block for various data storage devices, such as flip-flops, latches, or the like. Each of the NAND gates 502, 504 may output a "0" when both of the inputs are "1," and output a "1" when one or both of the inputs is a "0." The output 506 of the first NAND gate 502 is fed back into the input 512 of the second NAND gate 504. Likewise, the output 508 of the second NAND gate 504 is fed back into an input 510 of the first NAND gate 502.

When a "1" and a "0" are input on the input lines 514, 516, respectively, the circuit outputs a "0" and a "1" on the output lines 506, 508, respectively. Similarly, when a "0" and a "1" are input on the input lines 514, 516, respectively, the circuit outputs a "1" and a "0" on the output lines 506, 508, respectively. However, when a "1" is input on both of the input lines 514, 516, the circuit 500 outputs the values on the output lines 506, 508 just before both of the inputs 514, 516 changed to "1." Thus, the circuit 500 is able to "remember" or store a value. Normally, a condition where both of the inputs 514, 516 are "0" is considered illegal and is therefore not normally input to the circuit 500.

Figure 6:
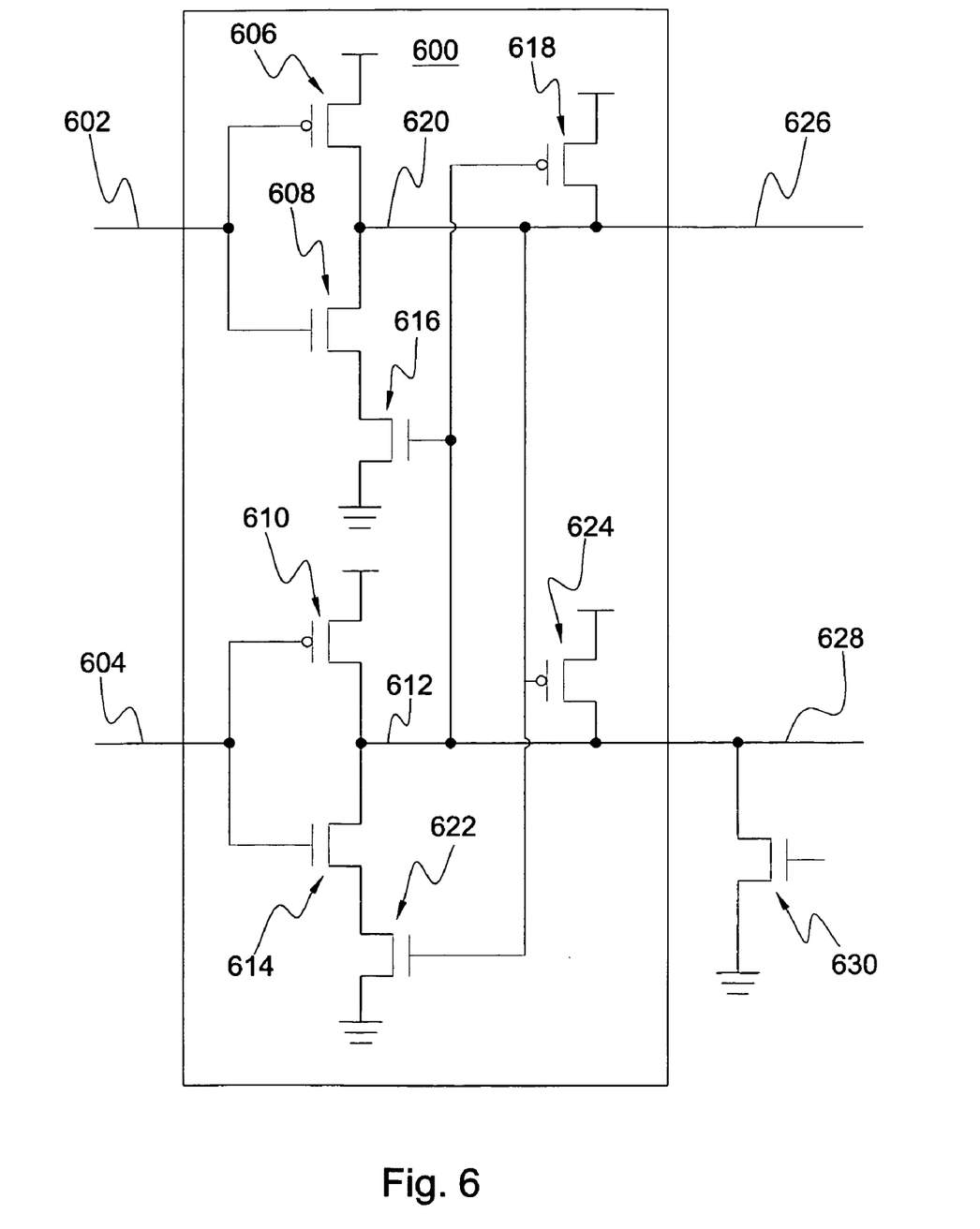
FIG. 6 is a schematic diagram of one embodiment of a bi-stable circuit implementing the circuit of FIG. 5, wherein the circuit is unbalanced.

Referring to FIG. 6, one embodiment of a bi-stable circuit using dual NAND gates is illustrated, wherein the NAND gates are implemented with transistors. In a first case, when the inputs 602, 604 are a "1" and a "0," respectively, the transistor 606 is open and the transistor 608 is closed. Likewise, the transistor 610 is closed and the transistor 614 is open, which drives the line 612 high. Because the line 612 is high, this closes the transistor 616 and opens the transistor 618. Because the transistor 616 is closed, this, in combination with the transistor 608 being closed, creates a short between the line 620 and ground, thereby driving the line 620 low. Because the line 620 is now low, this opens the transistor 622 and closes the transistor 624. Thus, when a "1" and a "0" are provided at the inputs 602, 604, respectively, this generates a "0" and a "1" on the output lines 626, 628, respectively.

If, after the inputs 602, 604 are a "1" and a "0," respectively, both of the inputs 602, 604, are driven high (to a logical value of "1"), then the transistor 610 would open and the transistor 614 would close. Although this breaks the connection between the voltage source and the line 612, the line 612 is nevertheless maintained "high" because the transistor 624 remains closed. Thus, when both of the inputs 602, 604 change to "1," the output lines maintain the values of "0" and "1," respectively. This allows the circuit 600 to "remember" or store the previous values present on the output lines 626, 628 before the inputs 602, 604 both change to a value of "1."

In a second case, when the inputs 602, 604 are a "0" and a "1," respectively, the transistor 610 is open and the transistor 614 is closed. Likewise, the transistor 606 is closed and the transistor 608 is open, which drives the line 620 high. Because the line 620 is high, this closes the transistor 622 and opens the transistor 624. Because the transistor 622 is closed, this, in combination with the transistor 614 being closed, creates a short between the line 612 and ground, thereby driving the line 612 low. Because the line 612 is now low, this opens the transistor 616 and closes the transistor 618. Thus, when a "0" and a "1" are provided at the inputs 602, 604, respectively, this generates a "1" and a "0" on the output lines 626, 628, respectively.

If, at this point, both of the inputs 602, 604, are driven high (to a logical value of "1"), then the transistor 606 would open and the transistor 608 would close. Although this breaks the connection between the voltage source and the line 620, the line 620 is nevertheless maintained "high" because the transistor 618 remains closed. Thus, when both of the inputs 602, 604 change to "1," the output lines maintain the values of "1" and "0," respectively, thereby remembering or storing these values.

As in the example illustrated in FIG. 2, in certain embodiments, circuitry 630 may be added to the bi-stable circuit 600 to provide some function. For example, as illustrated, a reset circuit 630 consisting of a single transistor 630 may be added to the bi-stable circuit 600. As was previously explained, because the bi-stable circuit 600 typically relies on a pair of cross-coupled NAND gates to function, this additional circuit 630 may create an imbalance in the circuit. This imbalance may be unimportant at lower operating temperatures. However, as the temperature of the circuit 600 rises, and as the leakage current of each device or transistor rises in proportion to the operating current, this imbalance may cause the bi-stable circuit to flip from one state to another or fail at temperatures lower than might otherwise occur if the circuit 600 was balanced. Thus, apparatus and methods are needed to balance the circuit 600 to provide more stable operation at higher temperatures.

Figure 7:
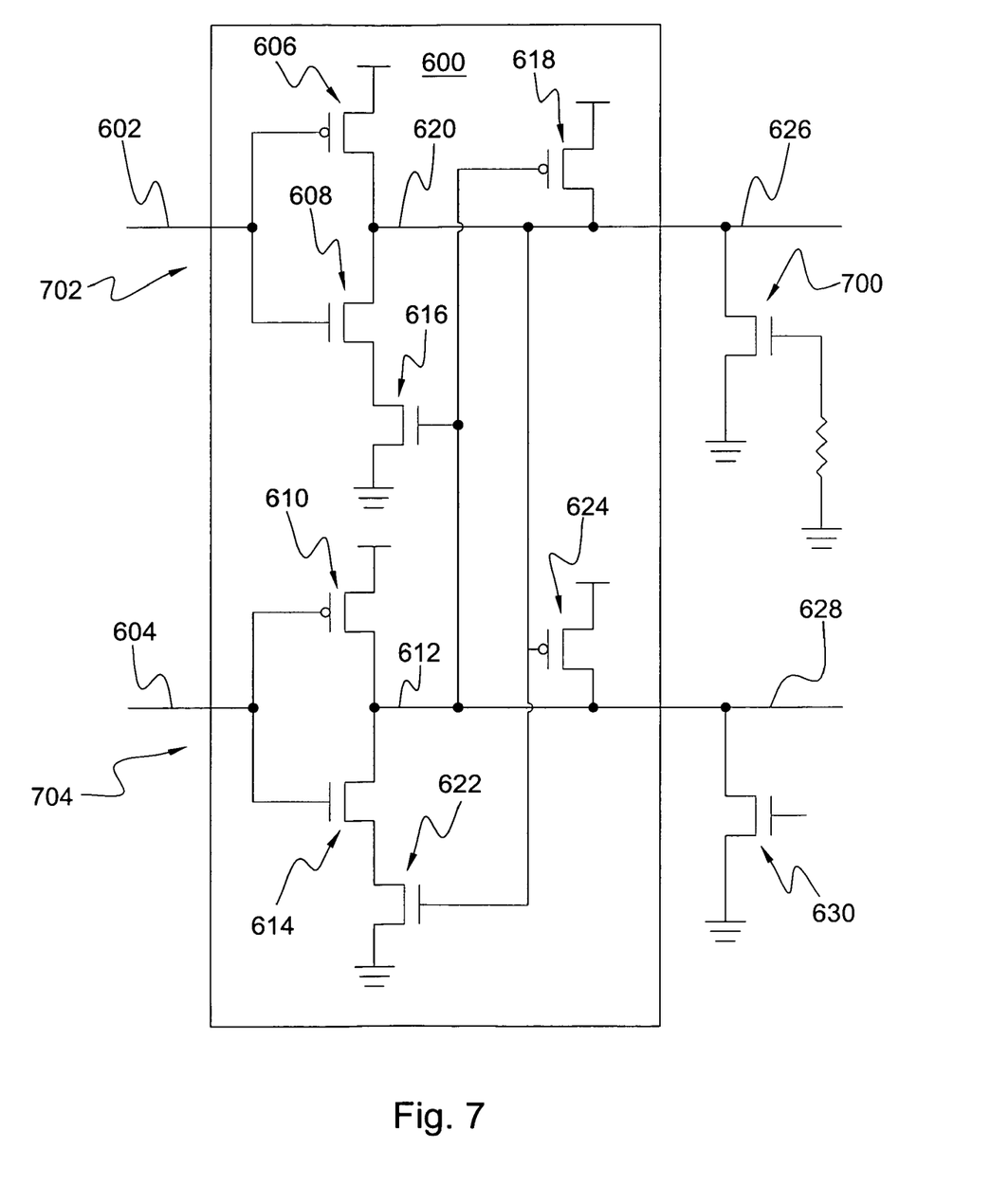
FIG. 7 is a schematic diagram of the bi-stable circuit of FIG. 6 in a more balanced configuration.

Referring to FIG. 7, in certain embodiments, in order to balance the circuit 600 and provide greater stability at higher temperatures, one or more components, such as a transistor 700, may be added to the circuit 600 to compensate for the addition of the reset circuit 630. Like the example illustrated in FIG. 4, the component 700 may provide some function to the circuit or may simply be a dead gate whose only function is to balance the circuit 600. Because the component 700 may be identical or nearly identical to the component 630, the resistance and leakage current of the components 700, 630 may behave identically or nearly identically as a function of temperature. Thus, the resistance and leakage current may be balanced or nearly balanced for both sides 702, 704 of the bi-stable circuit 600 for most temperatures.

Although the imbalance in this example was created by a single component 630, one of ordinary skill in the art will recognize that an imbalance may be created by the addition of more than one component. Thus, in certain embodiments, more than one component may be added to the bi-stable circuit 600 to compensate for this imbalance. Thus, FIGS. 6 and 7 are presented merely by way of example and are not intended to limit the invention to the illustrated embodiments.

The present invention may be embodied in other specific forms without departing from its essence or essential characteristics. The described embodiments are to be considered in all respects only as illustrative, and not restrictive. The scope of the invention is, therefore, indicated by the appended claims, rather than by the foregoing description. All changes within the meaning and range of equivalency of the claims are to be embraced within their scope.

Whereas the present invention has been described in particular relation to the drawings attached hereto, it should be understood that other and further modifications apart from those shown or suggested herein, may be made within the scope and spirit of the present invention.

We claim:

1. A state-holding circuit having improved stability at high temperatures, the state-holding circuit comprising:
    a bi-stable circuit having two reversible and stable states, wherein the bi-stable circuit comprises a plurality of logic components arranged into first and second inverting elements cross-coupled together, each inverting element having a substantially equivalent leakage current as a function of temperature;
    a functional circuit to at least one of set and reset the bi-stable circuit, the functional circuit connected between an output of one of the first and second inverting elements and ground, the functional circuit creating a leakage current imbalance between the first and second inverting elements; and
    a stabilization circuit connected between an output of the other of the first and second inverting elements and ground to reduce the leakage current imbalance created by the functional circuit.

2. The state-holding circuit of claim 1, wherein the plurality of logic components comprises a plurality of transistors.

3. The state-holding circuit of claim 1, wherein the first and second inverting elements comprise one of a pair of NAND gates and a pair of inverters.

4. The state-holding circuit of claim 1, wherein the output of the first inverting element is the inverse of the output of the second inverting element.

5. The state-holding circuit of claim 1, wherein the stabilization circuit comprises at least one dead gate.

6. The state-holding circuit of claim 1, wherein the bi-stable circuit is selected from the group consisting of a RAM cell, a flip-flop, and a latch.

7. The state-holding circuit of claim 1, wherein the bi-stable circuit is implemented using at least one of an application-specific integrated chip (ASIC), a field programmable gate array (FPGA), and discrete logic components.

8. The state-holding circuit of claim 1, wherein the bi-stable circuit is implemented using silicon-on-insulator (SOI) technology.

9. A method for increasing the stability of state-holding circuits at high temperatures, the method comprising:
    providing a bi-stable circuit having two reversible and stable states, wherein the bi-stable circuit comprises a plurality of logic components arranged into first and second inverting elements cross-coupled together, each inverting element having a substantially equivalent leakage current as a function of temperature;
    connecting a functional circuit between an output of one of the first and second inverting elements and ground to at least one of set and reset the bi-stable circuit, thereby creating a leakage current imbalance between the first and second inverting elements; and
    balancing the leakage current between the first and second inverting elements by connecting a stabilization circuit between an output of the other of the first and second inverting elements and ground.

10. The method of claim 9, wherein the plurality of logic components comprises a plurality of transistors.

11. The method of claim 9, wherein the first and second inverting elements comprise one of a pair of NAND gates and a pair of inverters.

12. The method of claim 9, wherein the output of the first inverting element is the inverse of the output of the second inverting element.

13. The method of claim 9, wherein the stabilization circuit comprises at least one dead gate.

14. The method of claim 9, wherein the bi-stable circuit is selected from the group consisting of a RAM cell, a flip-flop, and a latch.

15. The method of claim 9, further comprising implementing the bi-stable circuit using at least one of an application-specific integrated chip (ASIC), a field programmable gate array (FPGA), and discrete logic components.

16. The method of claim 9, further comprising implementing the bi-stable circuit using silicon-on-insulator (SOI) technology.

17. A state-holding circuit having improved stability at high temperatures, the state-holding circuit comprising:

a bi-stable circuit having two reversible and stable states, wherein the bi-stable circuit comprises a plurality of logic components arranged into first and second inverting elements cross-coupled together, each inverting element having a substantially equivalent net resistance;

a functional circuit to at least one of set and reset the bi-stable circuit, the functional circuit connected between an output of one of the first and second inverting elements and ground, the functional circuit creating a resistance imbalance between the first and second inverting elements; and a stabilization circuit connected between an output of the other of the first and second inverting elements and ground to balance the resistance between the first and second inverting elements.

* * * * *